United States Patent [19]
Robinson

[11] Patent Number: 5,122,686
[45] Date of Patent: Jun. 16, 1992

[54] POWER REDUCTION DESIGN FOR ECL OUTPUTS THAT IS INDEPENDENT OF RANDOM TERMINATION VOLTAGE

[75] Inventor: Barry J. Robinson, Austin, Tex.

[73] Assignee: Advanced Micro Devices, Inc., Sunnyvale, Calif.

[21] Appl. No.: 732,383

[22] Filed: Jul. 18, 1991

[51] Int. Cl.$^5$ ............... H03K 19/086; H03K 19/082
[52] U.S. Cl. ............................ 307/466; 307/455; 307/467; 307/296.6
[58] Field of Search ............... 307/466–467, 307/455, 443, 296.6; 323/312–315

[56] References Cited

U.S. PATENT DOCUMENTS

| | | | |
|---|---|---|---|
| 4,638,239 | 1/1987 | Hachimori | 323/314 |
| 4,804,861 | 2/1989 | Hollstein et al. | 307/296.6 |
| 4,812,734 | 3/1989 | Kohseik | 323/315 |
| 5,039,884 | 8/1991 | Hara | 307/296.6 |

Primary Examiner—David Hudspeth
Assistant Examiner—Andrew Sanders
Attorney, Agent, or Firm—Davis Chin

[57] ABSTRACT

A low voltage current mirror termination circuit used with an ECL gate array for providing a constant output emitter follower reference current (Ief) which is independent of voltage variations in a separate output emitter follower power supply source (VEF) includes a lateral PNP transistor (Qp), an NPN mirror transistor (Qx), at least one pull-down transistor (Qf), and at least one NPN output emitter follower transistor (Qo). The current through the collector of the lateral PNP transistor (Qp) defines a mirror current (Ip). The base of the lateral transistor (Qp) is connected to receive a base bias voltage VEP. The current through the collector of the pull-down transistor (Qf) defines the constant output emitter follower reference current (Ief) which is proportional to the mirror current (Ip). The separate emitter follower power supply source (VEF) has a voltage which is lower than a supply source (VEE) so as to reduce significantly the power consumption.

14 Claims, 3 Drawing Sheets

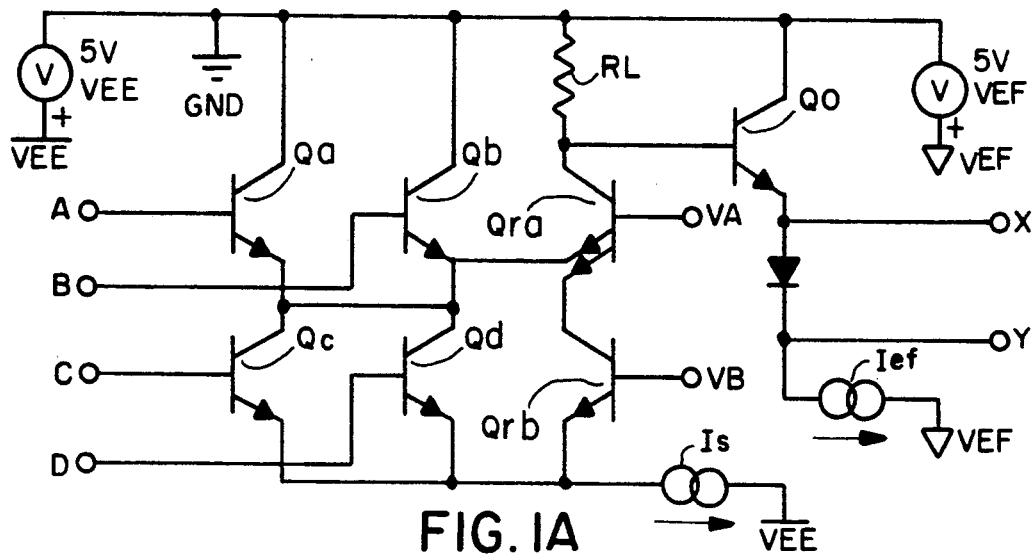
FIG. IA
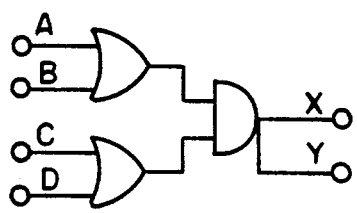
FIG. IB
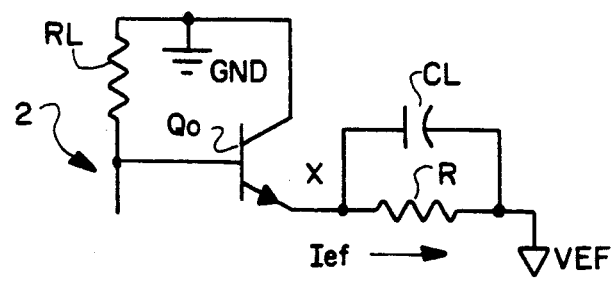
FIG. 2A (PRIOR ART)
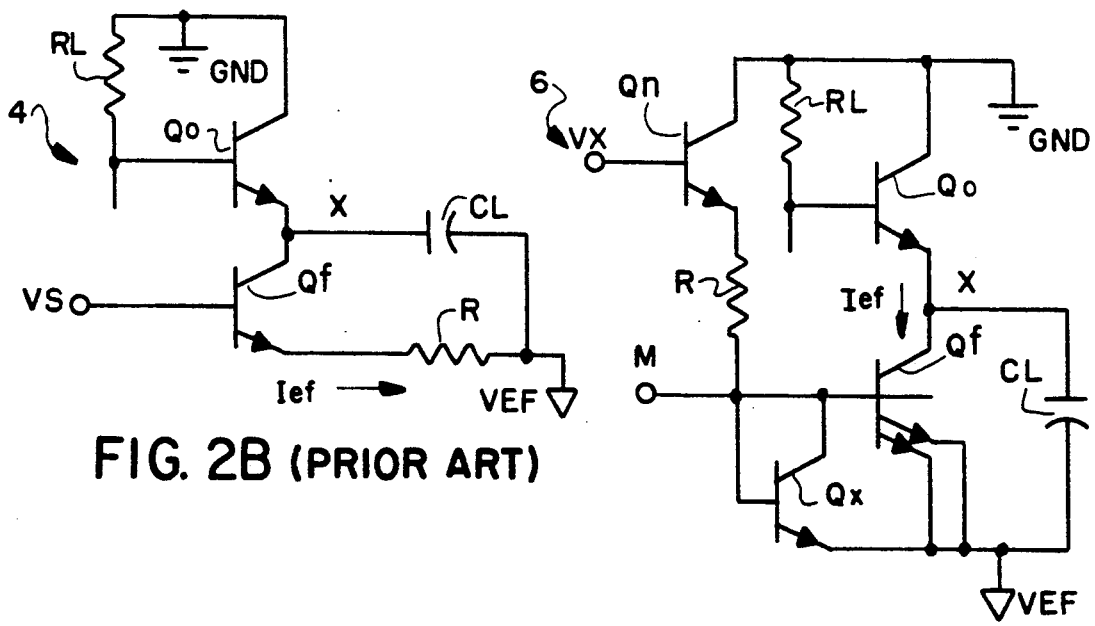
FIG. 2B (PRIOR ART)
FIG. 2C (PRIOR ART)

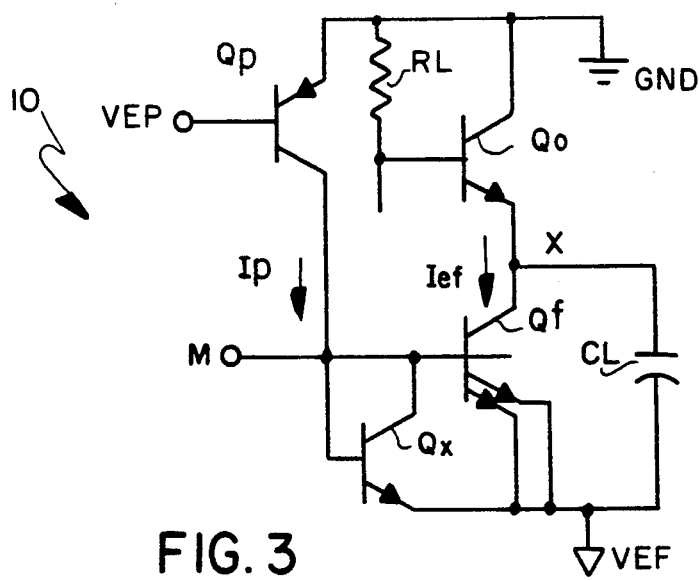
FIG. 3
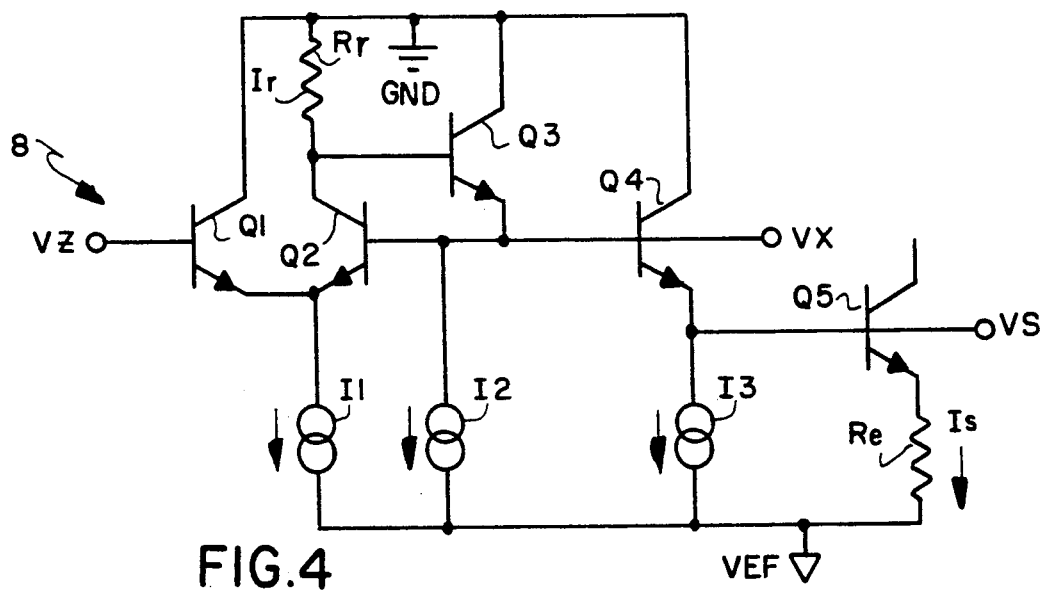
FIG. 4
FIG. 6

POWER REDUCTION DESIGN FOR ECL OUTPUTS THAT IS INDEPENDENT OF RANDOM TERMINATION VOLTAGE

BACKGROUND OF THE INVENTION

1. Field of the Invention

This invention relates generally to emitter-coupled logic (ECL) gate arrays and more particularly, it relates to a low voltage current mirror termination circuit for an ECL gate array having output emitter followers so as to reduce power consumption without compromising its operating speed.

2. Description of the Prior Art

A prior art search directed to the subject matter of this application in the U.S. Patent and Trademark Office revealed the following U.S. Pat. Nos.:

| | |
|---|---|
| 4,439,695 | 4,651,083 |
| 4,528,496 | 4,704,654 |
| 4,565,973 | 4,733,162 |
| 4,587,478 | 4,760,286 |
| 4,628,249 | |

As is generally well known in the art, an ECL macrocell function is typically formed of a multi-level transistor structure and an output emitter follower, which performs specified logical functions and is based on an identified circuit principle. For example, there is shown in FIG. 1A a conventional two-level ECL macrocell function which performs OR/AND logical operations. The symbolic representation of the OR/AND logical operations of FIG. 1A is illustrated in FIG. 1B. As can be seen, the first level includes a pair of input transistors Qa, Qb and a first reference transistor Qra. An input signal A is applied to the base of the transistor Qa, an input signal B is applied to the base of the transistor Qb, and a first reference voltage VA is applied to the base of the transistor Qra.

The second level includes a pair of input transistors Qc, Qd and a second reference transistor Qrb. An input signal C is connected to the base of the transistor Qc, an input signal D is connected to the base of the transistor Qd, and a second reference voltage VB is connected to the base of the transistor Qrb. A first power supply source GND, which is typically at 0 volts, is connected to the collectors of the input transistors Qa, Qb. A switch current Is is coupled between the common emitters of the transistors Qc, Qd and Qrb and a second power supply source VEE, which is typically at −5.0 volts.

Further, there is provided an output emitter follower transistor Qo whose emitter provides a first output X. A diode is connected between the first output X and a second output Y. An emitter follower reference current source Ief is connected between the second output Y and a separate emitter follower power supply source VEF. The amount of the emitter follower reference current Ief being drawn through the output emitter follower transistor Qo is typically equal to two or three times the value of the switch current Is. Accordingly, the amount of power consumption by an array of ECL macrocell functions similar to FIG. 1A may be significantly reduced by decreasing the voltage of the emitter follower power supply source VEF.

There have been many attempts made in the prior art to lower the voltage of the emitter follower power supply source VEF as shown in FIGS. 2A, 2B and 2C and more fully discussed below in the section entitled "Description of the Preferred Embodiments." However, the circuit arrangement of FIGS. 2A–2C each suffer from certain disadvantages and thus made their performance less than satisfactory.

SUMMARY OF THE INVENTION

Accordingly, it is a general object of the present invention to provide an improved low voltage current mirror termination circuit which is relatively simple and economical to manufacture and assemble, but yet overcomes the disadvantages of the prior art termination circuits.

It is an object of the present invention to provide a low voltage current mirror termination circuit for an ECL gate array having output emitter followers so as to reduce power consumption without compromising its operating speed.

It is another object of the present invention to provide a low voltage current mirror termination circuit which has constant current characteristics whose current level is substantially unaffected by variations in the voltage of an emitter follower power supply source connected thereto.

It is still another object of the present invention to provide a circuit arrangement which permits the distribution of matched current sources over large distances on a semiconductor chip, but yet utilizing a minimal number of component parts and avoiding the attendant base-emitter debiasing problems.

In accordance with these aims and objectives, there is provided in one preferred embodiment of the present invention a low voltage current mirror termination circuit used with an ECL gate array for providing a constant output emitter follower reference current which is independent of voltage variations in a separate emitter follower power supply source. The termination circuit includes a lateral PNP transistor, an NPN mirror transistor, at least one pull-down transistor, and at least one NPN output emitter follower transistor. The lateral transistor has its emitter connected to a first power supply source and its base coupled to receive a base bias voltage, and its collector connected to a mirror bias line. The mirror transistor has its base and collector connected to the mirror bias line and its emitter connected to the separate power supply source. The pull-down transistor has its base connected to the mirror bias line, its collector connected to an output terminal, and its emitter connected to the separate power supply source. The output emitter follower transistor has its base coupled to receive an ECL output logic signal, its collector connected to the first power supply source, and its emitter connected to the collector of the pull-down transistor. The current through the collector of the pull-down transistor defines the constant output emitter follower reference current which is proportional to the current through the collector of the lateral transistor defining a mirror current.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1A is a schematic circuit diagram of a conventional two-level ECL macrocell function having an output emitter follower;

FIG. 1B is a symbolic representation of the logical operations performed by the circuit of FIG. 1A;

FIG. 2A is a prior art emitter follower termination arrangement;

FIG. 2B is a second prior art emitter follower termination arrangement;

FIG. 2C is a third prior art emitter follower termination arrangement;

FIG. 3 is a low voltage current mirror termination circuit of the present invention;

FIG. 4 is a schematic circuit diagram of a reference voltage buffer;

FIG. 6 is a schematic circuit diagram of an alternate embodiment of the row bias generator of FIG. 5 so as to compensate for the Early effect.

DESCRIPTION OF THE PREFERRED EMBODIMENTS

Figure 5:
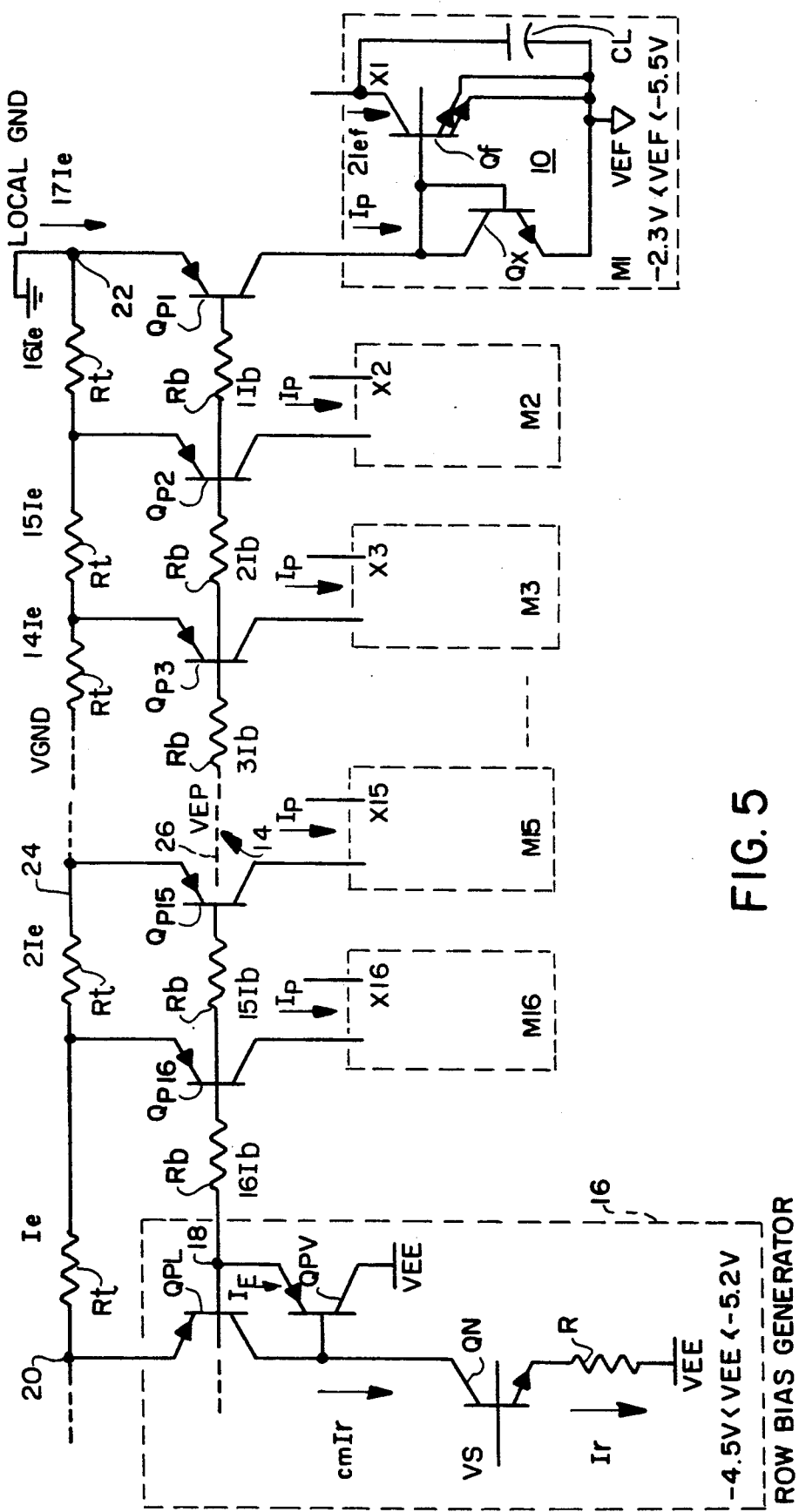
FIG. 5 is a simplified circuit representation of a macrocell row in a large ECL gate array, illustrating how the termination circuit in FIG. 3 of the present invention may be used.

Referring now to FIG. 2A of the drawings, there is shown a prior art emitter follower termination circuit 2 referred to as a resistive termination which includes an output emitter follower transistor Qo whose emitter (output X) is connected to a lower voltage of the emitter follower power supply source VEF through an emitter resistor R. The power supply source VEF may be made as small as a logic swing $V_L$ (voltage change between the level signifying a logic "1" and the level signifying a logic "0") allows and the value of the resistor R is chosen to provide the appropriate fall time. This voltage swing at the output X is provided by the change in the voltage across the resistor RL. The reference current Ief flows through the emitter resistor R. As the voltage of the emitter follower power supply source VEF is made smaller, the tolerances of the resistor R and the power supply source VEF will cause variations in the reference current Ief and thus the fall time will be changed. When there are large number of ECL gates, the emitter follower power supply source VEF tends to be quite noisy.

FIG. 2B depicts a second prior art emitter follower termination circuit 4 referred to as a current source termination which includes an output emitter follower transistor Qo whose emitter (output X) is connected to a lower voltage of the emitter follower power supply source VEF through a current source transistor Qf and an emitter resistor R. The base of the transistor Qf is biased by a supply reference voltage VS. The reference current Ief then flows through the emitter resistor R. Practical low impedance distribution networks for the reference voltage VS requires a voltage drop of 2 $V_{be}$ ($V_{be}$ of transistor Qo and $V_{be}$ of transistor Qf) plus an IR drop relative to the first or top rail power supply source GND. Further, the reference voltage VS itself must be regulated relative to a bottom rail. If the bottom rail is the second power supply source VEE, then the reference voltage VS is limited by the allowable number of logic levels. However, if the bottom rail is a separate emitter follower power supply source VEF then a distribution network will be required which is essentially a duplication of the reference voltage VS that powers the ECL gate. As a result, a significant power penalty is encountered when used in a large ECL gate array. With this limitation, the practical value of the minimum voltage of the emitter follower power supply source is approximately $-3.3$ volts (3 $V_{be} + I \times RL + VEF$ tolerance).

In FIG. 2C, there is illustrated a third prior art emitter follower termination circuit 6 referred to as a current mirror termination which includes a current source transistor Qn, an emitter resistor R, and a current mirror formed of transistors Qx and Qf. The base of the transistor Qn is connected to a regulated bias voltage VX. The emitter of the transistor Qn is connected to the mirror bias line M via the emitter resistor R. The emitter (output X) of the emitter follower transistor Qo is connected to the lower voltage of the source VEF through the mirror transistor Qf. The reference current Ief flowing through the mirror transistor Qf is determined by the area ratio of emitters of the transistors Qf, Qx; the bias voltage VX; and the value of the resistor R. Again, practical distribution of the regulated bias voltage VX limits the minimum voltage of the emitter follower power supply source VEF to approximately $-3.0$ volts. Further, a duplicate distribution network is also required since the current mirror termination is not referenced to a second power supply source VEE. The mirror bias line M is limited to local distribution because of the debiasing of the base-emitter drops of the transistors Qf and Qx.

In FIG. 4, there is shown a schematic diagram of a typical reference voltage buffer 8 which may be used to generate the required reference voltage VS and the bias voltage VX for the circuits of FIGS. 2B and 2C, respectively. The reference voltage buffer 8 is comprised of transistors Q1-Q5, resistors Rr and Re, and current sources I1-I3. The base of the transistor Q1 receives a regulated reference voltage VZ, which is from a bandgap reference generator (not shown). The reference voltage VS is a $V_{be}$ plus an IR drop relative to the power supply source VEF, and the bias voltage VX is 2 $V_{be}$ plus an IR drop relative to the source VEF. The variations in the power supply source VEF relative to the first power supply source GND are accommodated by the collector-emitter drop of the transistor Q2. Therefore, the minimum voltage of the power supply source VEF is 3 $V_{be} + Ir \times Rr + Is \times Re \approx 3.5$ volts.

A power consumption due to the output emitter follower transistors can be as much as 2 to 3 watts on large ECL gate arrays (i.e., more than 20,000 gates). Assuming that the average power dissipated per array gate is on the order of 1 or 2 mW, there could be conserved one watt of power by lowering the voltage of the emitter follower power supply reference VEF by one volt. This is enough power for operating another 1,000 array gate. Therefore, it would be desirable to provide a low voltage current mirror termination circuit 10 (FIG. 3) of the present invention for an ECL gate array having output emitter followers so as to reduce power consumed by a separate emitter follower power supply source VEF. It would also be expedient that the present low voltage current mirror termination circuit be adaptable for use with a typical reference voltage buffer of FIG. 4 for supplying the voltages VS and VX and suffers no speed penalty when ECL gate array users make changes in the voltage of the emitter follower power supply source VEF so as to accommodate their needs.

Accordingly, there is shown in FIG. 3 a schematic circuit diagram of a low voltage current mirror termination circuit 10 of the present invention. The termination circuit 10 provides an emitter follower reference current Ief which has constant current characteristics whose current level is substantially unaffected by variations in the voltage of the emitter follower power supply source VEF that is connected to the termination circuit. The termination circuit includes a lateral PNP mirror transistor Qp and current mirror formed of transistors Qx and Qf. The base of the transistor Qp is connected to a base bias voltage VEP. The mirror transistor Qp has its emitter connected to the first power supply source GND, and its collector connected directly to a mirror bias line M. The NPN current mirror transistor Qx is connected in a diode fashion with its base and collector connected to the mirror line M and its emitter connected to the lower voltage of the emitter follower power supply source VEF. The NPN pull-down transistor Qf has an emitter area A times larger than the NPN transistor Qx. The pull-down transistor Qf has its base connected to the mirror line M, its collector connected to the emitter (output X) of the output emitter follower transistor Qo, and its emitters connected to the source VEF. The emitter follower reference current Ief flowing through the transistor Qf is determined by the relative emitter areas of the transistors Qf and Qx, and the mirror current Ip flowing through the collector of the lateral PNP transistor Qp.

It will be noted that the base bias voltage VEP is a $V_{be}$ drop below the first power supply source GND or top rail and the mirror bias line M is a $V_{be}$ drop above the separate emitter follower power supply source VEF. The minimum voltage of the source VEF is thus no longer restricted by the distribution network for the bias voltage VX or the reference voltage VS, or by the local component biases such as the base-to-emitter voltage of the transistor QX and the saturation voltage $V_{ce(sat)}$ of the transistor Qp, but is determined by the voltage swing $V_L$ at the output X plus the saturation voltage of the transistor Qf. Therefore, the minimum voltage for the source VEF could be as low as −2.0 volts relative to the top rail. As a result, power consumption required by the output emitter follower transistor Qo would be approximately sixty percent less than the −5.0 volts for the source VEF and operating at the same speed.

In FIG. 5, there is shown a simplified circuit representation of a macrocell row in a large gate array, illustrating how the termination circuit 10 in FIG. 3 of the present invention may be used. As is generally known, a typical large ECL gate array is constructed of a plurality of matrix blocks (i.e., 4, 6 or more) each block containing a plurality of macrocell rows. Typically, each of the macrocell rows would have a plurality of macrocell functions. Each of the macrocell functions may be of a structure similar to that of FIG. 1. For example, each matrix block in the array may be formed of 16 macrocell rows with each macrocell row having 16 macrocell functions so as to provide a total of 256 macrocell functions. With the array being formed of, for instance, 4 matrix blocks, there would be provided 1,024 (1K) macrocell functions. Thus, FIG. 5 shows only a single macrocell row in one of the plurality of matrix blocks and the associated components connected therewith which are directed to the present invention.

As can be seen from FIG. 5, there are provided sixteen (16) macrocell functions M1 through M16. Each of the macrocell functions include a low voltage current mirror termination circuit 10 similar to FIG. 3 which consists of a lateral PNP transistor Qp, an NPN mirror transistor Qx, and at least one pull-down transistor Qf having one or more emitters so as to permit metal programming (i.e., desired speed/power levels). It will be noted that only the transistors Qx and Qf of the macrocell function M1 are shown. While the lateral transistor Qp and the output emitter follower transistor Qo (FIG. 3) are actually a part of the present termination circuit 10, the lateral transistor Qp in each of the macrocell functions M1–M16 have been separated therefrom so as to define the single macrocell row 14. Further, it should be apparent that the respective outputs X1–X16 of the corresponding functions M1–M16 are to be connected to a corresponding output emitter follower transistor Qo thereof. These emitter follower transistors and the remaining components in each of the macrocell functions have been purposely omitted for the sake of clarity.

A row bias generator 16 is used to provide the base bias voltage VEP for the bases of the lateral transistors Qp1–Qp16 and consists of a current source transistor QN, a lateral PNP transistor QPL, and a vertical PNP transistor QPV. The base of the transistor QN is connected to reference voltage VS which is obtained from the buffer of FIG. 4. The base bias voltage VEP at node 18 is connected to the bases of the lateral transistors Qp1–Qp16 of the termination circuit 10 through metal traces of the base rail on line 26 which are represented by resistances Rb. The emitter of the lateral transistor QPL of the row bias generator 16 is connected at node 20 to the first power supply source GND at node 22 via metal traces of the top rail 24 which are represented by resistances Rt. Each of the metal traces are of an uniform length L in each macrocell function.

If $B_L$ is the beta of the lateral PNP transistor QPL, then the current $I_E$ into the emitter of the vertical PNP transistor QPV is given by:

$$I_E = I_p(n+1)/B_L \quad (1)$$

where $I_p$ is the desired mirror current in the transistor Qx.
n is the number of programmed macrocell functions.

Further, the collector current Ic of the current source transistor QN is the sum of the collector current of the lateral transistor QPL and the base current of the vertical transistor QPV, which is:

$$I_C = I_p + I_p(n+1)/B_L B_v \quad (2)$$

where $B_V$ is the beta of the transistor QPV.

Therefore, the emitter current Ir, which is set by the resistor R, of the current source transistor QN becomes:

$$I_R = [I_p + I_p(n+1)/B_L B_V]/a_n \quad (3)$$

where $a_n$ is the alpha of the transistor QN.

For a typical process, $a_n \approx 0.98$, $B_L \approx 15$, and $B_V \geq 50$. By assuming that $B_L B_V$ is<) (n+1), then the mirror current Ip in equation (3) is approximately $a_n I_r$. As a result, the mirror current Ip and thus the emitter follower reference current Ief has been shown to be virtually independent of the process parameters of the PNP transistor Qp and is determined by setting the reference voltage VS. Accordingly, the output emitter follower reference current Ief will track the current source Is and the alpha of the NPN transistors in the macrocell function. Moreover, since the single emitter resistor R in the row bias generator 16 is used to set the current Ir and thus the current Ief rather than by resistors in macrocell functions M1-M16, the single resistor R can be made of a higher tolerance with minimal area penalty and with the attendant power saving.

Since the macrocell row 14 serviced by the single row bias generator 16 can extend over a large distance on the semiconductor chip, the lateral PNP transistors (i.e., Qp1-Qp16) which generate the mirror currents Ip are subject to base-emitter debiasing due to the currents Ie and Ib (as shown in FIG. 5) flowing in the respective resistances Rt and Rb. While better matching could be achieved by insertion of a dedicated resistor in series with the emitter of each PNP transistor, this is disadvantageous since it increases the total component count per macrocell function. By using the technique described hereinafter, the use of the extra resistive components can be avoided through selective use of the two metallic layers commonly available on most ECL gate arrays.

Referring again to FIG. 5, the total voltage drops along the local ground line 24 of the furthest macrocell function (M1) from the bias generator to the emitter (node 18) of the transistor QPV can be expressed as follows:

$$V = \sum_{i=1}^{n} nI_e R_t = I_e R_t \sum_{i=1}^{n} n = \quad (4)$$

$$I_e R_t \frac{n}{2}(n+1) = I_e \rho_t \frac{L}{W_t} \frac{n}{2}(n+1)$$

where
$I_e = I_p/\alpha_p$ and
$R_t = \rho_t L/W_t$
$\rho_t$ is the sheet resistivity of the top rail
$W_t$ is the width of the top rail
L is the length of the macrocell along the row
n is the number of programmed macrocell functions.

Similarly, the total voltage drops along the base rail line 26 from the furthest macrocell function (M1) to the node 18 can be expressed as follows:

$$V = \sum_{i=1}^{n} nI_b R_b = I_b R_b \sum_{i=1}^{n} n = \quad (5)$$

$$I_b R_b \frac{n}{2}(n+1) = I_b \rho_b \frac{L}{W_b} \frac{n}{2}(n+1)$$

where
$I_b = I_b/B_L$ and
$R_b = \rho_b L/W_b$
$\rho_b$ is the sheet resistivity of the base rail
$W_b$ is the width of the base rail
L is the length of the macrocell along the row
n is the number of programmed macrocell functions.

Therefore, the ratio of the total voltage drops along the local ground line 24 to the total voltage drops along the base rail line 26 is equation (4) divided by equation (5), or:

$$\frac{V_{GND}}{V_{VEP}} = \frac{I_e \rho_t \frac{L}{W_t} \frac{n}{2}(n+1)}{I_b \rho_b \frac{L}{W_b} \frac{n}{2}(n+1)} = \frac{(B_L+1)\rho_t W_b}{\rho_b W_t} \quad (6)$$

For a typical process, $B_L \approx 20$, $W_b = 2u$, $W_t = 10\ u$, $\rho_t = 18\ m\Omega/sq$, and $\rho_b = 72\ m\Omega/sq$. By substituting thse values into equation (6), the ratio $V_{GND}/V_{VEP}$ is approximately 1 for a fully programmed row. From equation (6), it can be seen that the width $W_t$ of the top metal trace should be selected to be equal to $(B_L+1)\rho_t W_b/\rho_b$ in order that the transistor at either end will have nearly the same $V_{be}$ and thus the same mirror currents Ip.

From FIG. 5, there can be derived an expression which describes the voltage rise from the base of the transistor QPL as a function of the nth macrocell function along the local ground line 24 and is given by:

$$\Delta V_{GNDn} = \phi_{po} + V_t n/2(n+1) \quad (7)$$

where
$\phi_{po} = V_{be}$ of the transistor QPL
and $V_t = I_e \rho_t L/W_t \approx 0.115$ mV at worst case Similarly, a corresponding expression can be derived which describes the voltage rise from the base of the transistor QPL as a function of the nth macrocell function along the base rail line 26 and is given by:

$$\Delta V_{VEPn} = V_b n/2(1+N-n) \text{ for } n_{max} = N \quad (8)$$

where
N = total number of macrocell functions
n = number of a particular macrocell function
$V_b = I_b \rho_b L/W_b$ Thus, since $V_t = V_b$ then the $V_{be}$ mismatch $\Delta\phi_{pn}$ is expressed as follows:

$$\Delta V_{GNDn} - \Delta V_{VEPn} - \phi_{po} = V_t n(n-N) \quad (9)$$

For $n = \phi$ or N, then $\Delta\phi_{pn}$ is zero as expected. By differentiating the equation (9) with respect to n and setting the result to $\phi$, the minimum mismatch is found to occur at $n = N/2$. It should be apparent to those skilled in the art that the macrocell row 14 of FIG. 5 has two equal "hog" transistors at each end and "starved" transistors therebetween. By plugging $n = N/2$ into equation (9), it can be seen that this gives the worst case mismatch of $-V_t N^2/4$. Consequently, the mismatch of the mirror currents Ip can be reduced by a factor of 4 by placing the row bias generator 16 in the middle of the N macrocell functions since the mismatch is directly proportional to $N^2$. For example, assuming that Ip = 200 uA, L = 200 u, and N = 8 (the minimum mismatch is thus at $n = 4$), we have by equation (9):

$$\phi_{p4} = V_t n(n-N) = V_t 4(4-8) = -16 V_t \quad (10)$$

Since $V_t = (0.115\ mV)$, then $\phi_{p4} = -16(0.115\ mV) = -1.84$ mV and thus, $\Delta I_{p4} \approx -7\%$.

In the fabrication of ECL gate arrays, process parameters are optimized so as to provide for high frequency NPN transistors and does not provide unfortunately close tolerances on the lateral PNP transistors Qp. Therefore, the constancy of the emitter follower reference current Ief will be adversely affected by a so-called Early effect wherein, in the active portion of the family of characteristic curves of the transistor, the collector current is not independent of the collector-emitter voltage and will rise with increasing collector-emitter voltages. As a result, in order for the termination circuit 10 to be truly independent of voltage changes in the emitter follower power supply source VEF, the tolerances introduced by the Early effect of the lateral PNP transistors must be taken into consideration. For example, if the Early effect modulates the collector current at the rate 10 uA/V and the source VEF is specified at 3.5 volts ±1.5 volts, then there would be a current source variation of ±15 uA. For a nominal mirror current Ip=200 uA, this results in a variation of ±7.5%.

In order to compensate for the Early effect, the row bias generator of FIG. 5 can be modified to the one shown in FIG. 6. The row bias generator 16a of FIG. 6 includes a lateral PNP transistor QPL, a vertical PNP transistor QPV, and a current source transistor QN which conforms entirely with the circuit arrangement of FIG. 5. The row bias generator 16a further includes a pair of NPN transistors Qs, Qm and three-resistor network 28 formed of resistors Ru, Rf, and R1. The transistor Qs has its base connected to receive the bias voltage VX from the buffer of FIG. 4, its collector connected to the first power supply source GND, and its emitter connected to one end of the resistor Ru. The transistor Qm is connected in a diode fashion with its base and collector connected to one of the resistor R1 and its emitter connected to the second power supply source VEE. The other end of the resistor Ru is tied to the other end of the resistor R1 and to one end of the resistor Rf. The other end of the resistor Rf is connected to the separate emitter follower power supply source VEF. By Kirchoff's current law, the current at node 32 can be expressed as follows:

$$(V_s - V_n)/R_u = (V_n - VEF)/R_f + (V_n - V_m)/R_1 \quad (11)$$

By letting $a = R_1/R_u$ and $b = R_1/R_f$, we have:

$$V_n = (bVEF + aV_s + V_m)/(1 + a + b) \quad (12)$$

By differentiating equation (12) with respect to VEF, there is given:

$$\frac{dV_n}{dVEF} = \frac{b}{1+a+b} = \quad (13)$$

$$\frac{R_1/R_f}{(1 + R_1/R_u + R_1/R_f)} = \frac{\sigma_f}{(\sigma_1 + \sigma_u + \sigma_f)}$$

where
$\sigma_f = 1/R_f$
$\sigma_u = 1/R_u$
$\sigma_1 = 1/R_1$

Assuming that Ru=800Ω, R1=1.2KΩ, and Rf=13 kΩ, and that the emitter follower power supply source VEF is varied from −2.0 volts to −6.0 volts, then since $dV_n/dVEF$ is a constant, we have from equation (13):

$$\Delta V_n = \Delta VEF\left(\frac{dV_n}{dVEF}\right) = \quad (14)$$

$$[(-6V) - (-2V)][0.0352] = -140mV$$

In operation, it will be noted that as the source VEF is decreased from −2.0 volts to −6.0 volts, the base-collector voltages of the lateral PNP transistors Qp will increase and modulate their base current thereby increasing the corresponding mirror currents Ip. However, since a lower voltage of the source VEF will cause an increased current through the resistor Rf of the network 28, this will lower the voltage Vn at the node 32 applied to the base of the diode-connected transistor Qm. As a result, the programmed current Ipo through the current source transistor QN will be reduced, thereby effectively compensating for the Early voltage change.

From the foregoing detailed description, it can thus be seen that the present invention provides a low voltage current mirror termination circuit which permits a relatively wide range of voltages from a separate emitter follower power supply source to be applied to the output emitter follower transistors of an ECL gate array. The present termination circuit utilizes a separate emitter follower power supply source, which is lower than the supply source VEE, so as to reduce significantly the power consumption. The termination circuit further provides an emitter follower reference current Ief which has constant current characteristics whose current level is substantially unaffected by voltage variations of the separate emitter follower power supply source. The circuit arrangement permits the distribution of matched current sources over large distances on a semiconductor chip, but yet using a minimal number of component parts and avoiding the attendant base-emitter debiasing problems.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In an ECL gate array including a plurality of macrocell functions arranged in a plurality of rows with each of said plurality of rows having a predetermined number of said plurality of macrocell functions, each of said plurality of macrocell functions having a low voltage current mirror termination circuit for generating a constant emitter follower reference current which is independent of voltage variations in a separate output emitter follower power supply source, said termination circuit comprising:

a lateral PNP transistor (Qp) having its emitter connected to a first power supply source (GND), its base coupled to receive a base bias voltage (VEP), and its collector connected to a mirror bias line (M);

an NPN mirror transistor (Qx) having its base and collector connected to said mirror bias line (M) and its emitter connected to a separate power supply source (VEF);

at least one pull-down transistor (Qf) having its base connected to said mirror line (M), its collector connected to an output terminal (X), and its emitter connected to the separate power supply source (VEF);

at least one NPN output emitter follower transistor (Qo) having its base coupled to receive an ECL output logic signal, its collector connected to said first power supply source (GND) and its emitter connected to the collector of said pull-down transistor (Qf);

the current through the collector of said pull-down transistor (Qf) defining the constant output emitter follower reference current (Ief) which is proportional to the current through the collector of said lateral PNP transistor (Qp) defining a mirror current (Ip);

a predetermined number of said lateral PNP transistors (Qp) of said termination circuits in said macrocell functions being arranged to define a macrocell row; and row bias generator means (16, 16a) for generating said base bias voltage (VEP).

2. In an ECL gate array as claimed in claim 1, wherein said row bias generator (16) includes a lateral PNP transistor (QPL), a vertical PNP transistor (QPV), and a current source transistor (QN), said lateral transistor (QPL) having its emitter connected to said first power supply source (GND), its base connected to the emitter of said vertical transistor (QPV), and its collector connected to the base of said vertical transistor (QPV) and to the collector of said current source transistor (QN), said vertical transistor (QPV) having its collector connected to the second power supply source (VEE), said current source transistor (QN) having its base connected to a reference voltage (VS) and its emitter coupled to a second power supply source (VEE) via a resistor (R), said mirror current (Ip) through the collector of said lateral transistor (QPL) being proportional to the current (Ir) through the emitter of said current source transistor (QN).

3. In an ECL gate array as claimed in claim 2, wherein said input emitter follower power supply source (VEF) has a lower voltage than said second power supply source (VEE).

4. In an ECL gate array as claimed in claim 1, wherein said row bias generator (16a) includes means for compensating for the Early effect of the lateral PNP transistor (QP).

5. In an ECL gate array as claimed in claim 4, wherein said row bias generator (16a) includes a lateral PNP transistor (QPL), a vertical PNP transistor (QPV), a current source transistor (QN), a pair of first and second NPN transistors (Qs, Qm) and a resistor network (28), said lateral transistor (QPL) having its emitter connected to said first power supply source (GND), its base connected to the emitter of said vertical transistor (QPV), and its collector connected to the base of said vertical transistor (QPV) and to the collector of said current source transistor (QN), said vertical transistor (QPV) having its collector connected to the second power supply source (VEE), said current source transistor (QN) having its base connected to a reference voltage (VS) and its emitter coupled to a second power supply source (VEE) via a resistor (R), said mirror current (Ip) through the collector of said lateral transistor (QPL) being proportional to the current (Ir) through the emitter of said current source transistor (QN).

6. In an ECl gate array as claimed in claim 5, wherein said resistor network (28) is formed of first, second and third resistors (Ru, Rf, Rl).

7. In an ECl gate array as claimed in claim 1, wherein said row bias generator means is arranged in the middle of said macrocell row so as to minimize the de-biasing of said base-emitter voltage of said lateral PNP transistors (Qp).

8. A low voltage current mirror termination circuit used with an ECL gate array for providing a constant output emitter follower reference which is independent of voltage variations in a separate output emitter follower power supply source, said termination circuit comprising:

a lateral PNP transistor (Qp) having its emitter connected to a first power supply source (GND), its base coupled to receive a base bias voltage (EP), and its collector connected to a mirror bias line (M);

an NPN mirror transistor (Qx) having its base and collector connected to said mirror bias line (M) and its emitter connected to a separate power supply source (VEF);

at least one pull-down transistor (Qf) having its base connected to said mirror line (M), its collector connected to an output terminal (X), and its emitter connected to the separate power supply source (VEF);

at least one NPN output emitter follower transistor (Qo) having its base coupled to receive an ECL output logic signal, its collector connected to said first power supply source (GND) and its emitter connected to the collector of said pull-down transistor (Qf); and the current through the collector of said pull-down transistor (Qf) defining the constant output emitter follower reference current (Ief) which is proportional to the current through the collector of said lateral PNP transistor (Qp) defining a mirror current (Ip).

9. A low voltage current mirror termination circuit as claimed in claim 8, wherein said pull-down transistor (Qf) has a plurality of emitters which permits metal programming for providing said reference current (Ief) to be a multiple of said mirror current (Ip) in order to obtain desired speed/power levels.

10. In an ECL gate array as claimed in claim 8, wherein said input emitter follower power supply source (VEF) has a lower voltage than said second power supply source (VEE).

11. A low voltage current mirror termination circuit as claimed in claim 8, further comprising reference generator means (16, 16a) for generating said base bias voltage (VEP).

12. In an ECL gate array as claimed in claim 11, wherein said reference generator (16) includes a lateral PNP transistor (QPL), a vertical PNP transistor (QPV), and a current source transistor (QN), said lateral transistor (QPL) having its emitter connected to said first power supply source (GND), its base connected to the emitter of said vertical transistor (QPV), and its collector connected to the base of said vertical transistor (QPV) and to the collector of said current source transistor (QN), said vertical transistor (QPV) having its collector connected to the second power supply source (VEE), said current source transistor (QN) having its base connected to a reference voltage (VS) and its emitter coupled to a second power supply source (VEE) via a resistor (R), said mirror current (Ip) through the collector of said lateral transistor (QPL) being proportional to the current (Ir) through the emitter of said current source transistor (QN).

13. In an ECL gate array as claimed in claim 8, wherein said reference generator (16a) includes means for compensating for the Early effect of the lateral PNP transistor (QP).

14. A row bias generator for generating a base bias voltage (VEP) which is compensated for an Early effect, comprising:
- a lateral PNP transistor (QPL);
- a vertical PNP transistor (QPV);
- a current source transistor (QN);
- said lateral transistor (QPL) having its emitter connected to a first power supply source (GND), its base connected to the emitter of said vertical transistor (QPV), and its collector connected to the base of said vertical transistor (QPV) and to the collector of said current source transistor (QN);
- said vertical transistor (QPV) having its collector connected to a second power supply source (VEE);
- said current source transistor (QN) having its emitter connected to said second power supply source (VEE);
- a first NPN transistor (Qs) having its collector connected to said first power supply source (GND) and its base connected to a reference voltage (VX);
- a resistive network (28) formed of first, second and third resistors (Ru, Rf, Rl), said first resistor (Ru) having its one end connected to the emitter of said first NPN transistor (Qf) and its other end connected to one end of said second and third resistors (Rf, Rl) at a node, the other end of said second resistor (Rf), being connected to an output emitter follower power supply source (VEF);
- a second NPN transistor (Qm) having its base and collector connected to the other end of said third resistor (Rl) and to the base of said current source transistor (QN) and its emitter connected to said second power supply source (VEE); and
- said node having a voltage responsive to said emitter follower power supply source (VEF) for controlling a programmed current (Ipo) through the collector of said current source transistor (QN) so as to compensate for the Early voltage change in said lateral transistor (QPL).

* * * * *

UNITED STATES PATENT AND TRADEMARK OFFICE
CERTIFICATE OF CORRECTION

PATENT NO. : 5,122,686

DATED : June 16, 1992

INVENTOR(S) : Barry J. Robinson

It is certified that error appears in the above-identified patent and that said Letters Patent is hereby corrected as shown below:

Column 6, line 58, change "<)" to --≫--.

Column 12, line 7, change "(EP)" to --(VEP)--.

Signed and Sealed this

Fourteenth Day of September, 1993

Attest:

BRUCE LEHMAN

*Attesting Officer*  *Commissioner of Patents and Trademarks*